United States Patent [19]

Bickford et al.

[11] Patent Number: 4,862,322

[45] Date of Patent: Aug. 29, 1989

[54] DOUBLE ELECTRONIC DEVICE STRUCTURE HAVING BEAM LEADS SOLDERLESSLY BONDED BETWEEN CONTACT LOCATIONS ON EACH DEVICE AND PROJECTING OUTWARDLY FROM THEREBETWEEN

[76] Inventors: Harry R. Bickford, 57 Sherwood Ave., Ossining, N.Y. 10562; Mark F. Bregman, 63 Old Washington Rd., Ridgefield, Conn. 06877; Paul A. Moskowitz, R.D. #1, Box 343, Hunterbrook Rd., Yorktown Heights, N.Y. 10598; Michael J. Palmer, R.D. #2, Box 372, Walden, N.Y. 12586; Timothy C. Reiley, 16865 Kennedy Rd., Los Gatos, Calif. 95032; Paige A. Poore, 1214 Huntsman Dr., Durham, N.C. 27713; Caroline A. Kovac, 20 Blue Ridge Rd., Ridgefield, Conn. 06877

[21] Appl. No.: 188,805

[22] Filed: May 2, 1988

[51] Int. Cl.[4] ............................................. H05K 7/20
[52] U.S. Cl. ..................................... 361/386; 357/75; 228/180.2; 361/396; 361/413
[58] Field of Search ................... 361/321 C, 380, 383, 361/386, 387, 388, 396, 400, 401, 403, 404, 405, 412, 413, 414; 357/51, 75 X, 80, 81; 174/52.4, 16.3; 29/832, 854; 206/328, 331; 228/180.2 X, 6.2, 44.7; 439/44, 55, 65, 68, 69, 70, 72, 75, 84

[56] References Cited

U.S. PATENT DOCUMENTS

| Re. 26,899 | 5/1970 | Dion et al. ............................ 317/101 |
| 3,148,310 | 9/1964 | Feldman .............................. 317/101 |

(List continued on next page.)

FOREIGN PATENT DOCUMENTS

| 52-75981 | 6/1977 | Japan . |
| 54-144872 | 12/1979 | Japan . |
| 56-24955 | 3/1981 | Japan . |
| 56-62350 | 5/1981 | Japan . |
| 54-137623 | 5/1981 | Japan . |
| 56-137665 | 10/1981 | Japan . |
| 57-40945 | 3/1982 | Japan . |
| 58-159361 | 9/1983 | Japan . |
| 59-113650 | 6/1984 | Japan . |
| 59-229850 | 12/1984 | Japan . |
| 60-37758 | 2/1985 | Japan . |
| 8101124 | 4/1982 | PCT Int'l Appl. . |
| 8300214 | 5/1985 | PCT Int'l Appl. . |

OTHER PUBLICATIONS

IBM Technical Disclosure Bulletin, vol. 21, No. 6 (Nov. 1978), pp. 2318–2319, "Integrated Seal and Signal Band for Stacked Modules", by Clark et al.

J. Electronic Engineering, Feb. 1985, p. 20, "NEC Lamination Method Bonds Chips Face to Face".

IBM Technical Disclosure Bulletin, vol. 22, No. 2 (Jul. (List continued on next page.)

Primary Examiner—Gerald P. Tolin

[57] ABSTRACT

An integrated circuit device package in which integrated circuit devices are mounted with active faces placed facing each other to form a double-device structure. Input/output terminals on the active faces of each device can be electrically interconnected by placing an interconnection means between the chips to electrically interconnect input/output terminals on the active faces of the first and second device. Beam leads, each having an inner and outer lead bond site, project outwardly from between the devices where each of the inner lead bond site is solderlessly bonded between conducting patterns on each device bonded. A series of double-device structures can be formed on a tape having a plurality of sets of beam lead patterns thereon. Each beam lead of each set having an inner and outer lead bond site, projects outwardly from between the double-device structure, the inner lead bond site being solderlessly bonded between conducting patterns on each device.

12 Claims, 13 Drawing Sheets

U.S. PATENT DOCUMENTS

| | | | |
|---|---|---|---|
| 3,243,661 | 3/1966 | Ullery, Jr. | 317/101 |
| 3,440,722 | 4/1969 | Paulson | 29/626 |
| 3,518,751 | 7/1970 | Waters et al. | 29/577 |
| 3,648,131 | 3/1972 | Stuby | 317/235 R |
| 3,670,208 | 6/1972 | Hovnanian et al. | 317/101 CM |
| 3,772,776 | 11/1973 | Weisenburger | 29/628 |
| 3,795,047 | 3/1974 | Abolafia et al. | 29/625 |
| 3,880,493 | 4/1975 | Lockhard, Jr. | 339/147 |
| 3,904,934 | 9/1975 | Martin | 317/101 D |
| 3,912,984 | 10/1975 | Lockhart, Jr. et al. | 317/101 CC |
| 4,000,509 | 12/1976 | Jarvela | 357/81 |
| 4,067,104 | 1/1978 | Tracy | 29/626 |
| 4,074,342 | 2/1978 | Honn et al. | 361/411 |
| 4,208,698 | 6/1980 | Narasimhan | 361/414 |
| 4,249,196 | 2/1981 | Durney et al. | 357/74 |
| 4,288,841 | 9/1981 | Gogal | 361/414 |
| 4,296,456 | 10/1981 | Reid | 361/403 |
| 4,363,076 | 12/1982 | McIver | 361/386 |
| 4,408,256 | 10/1983 | Val | 361/403 |
| 4,417,392 | 11/1983 | Ibrahim et al. | 29/840 |
| 4,423,468 | 12/1983 | Gatto et al. | 361/404 |
| 4,437,235 | 3/1984 | McIver | 29/840 |
| 4,451,845 | 5/1984 | Philofsky et al. | 357/72 |
| 4,453,176 | 6/1984 | Chance et al. | 357/51 |
| 4,521,828 | 6/1985 | Fanning | 361/386 |
| 4,541,003 | 9/1985 | Otsuka et al. | 357/74 |
| 4,577,214 | 3/1986 | Schaper | 357/74 |
| 4,585,157 | 4/1986 | Belcher | 228/180.2 |
| 4,587,395 | 5/1986 | Oakley | 219/121.64 |
| 4,587,594 | 5/1986 | McPherson | 361/383 |
| 4,636,918 | 1/1987 | Jodoin | 361/405 |
| 4,661,192 | 4/1987 | McShane | 228/180.2 |
| 4,736,882 | 4/1988 | Winter | 228/44.7 |
| 4,748,538 | 5/1988 | Tsuji | 361/386 |

OTHER PUBLICATIONS

1979), pp. 525–526, "Low–Cost Stacked Module", by J. Rasile et al.

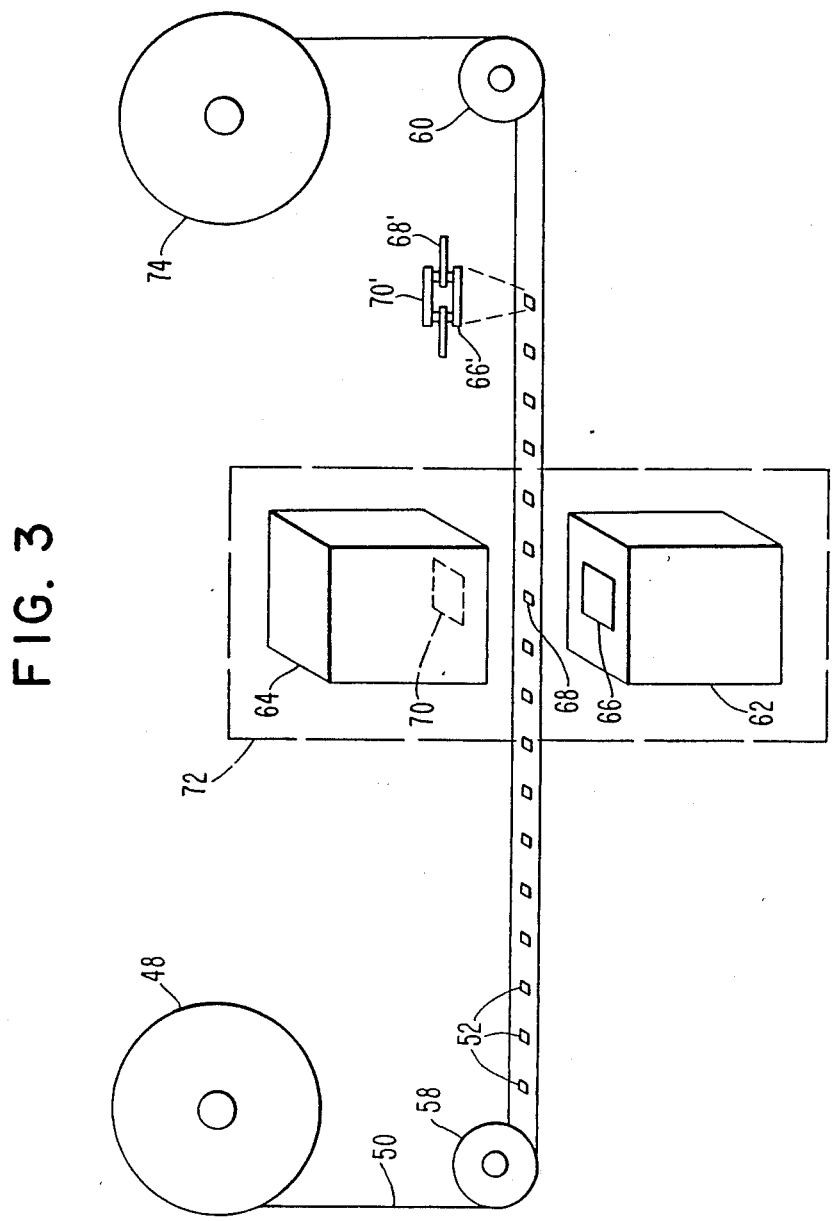

DOUBLE ELECTRONIC DEVICE STRUCTURE HAVING BEAM LEADS SOLDERLESSLY BONDED BETWEEN CONTACT LOCATIONS ON EACH DEVICE AND PROJECTING OUTWARDLY FROM THEREBETWEEN

CROSS REFERENCES TO RELATED COPENDING APPLICATIONS

Copending U.S. pat. application No. YO987-106 filed on the same date as the present application and entitled "CONFORMAL SEALING AND INTERPLANAR ENCAPSULATION OF ELECTRONIC DEVICE STRUCTURES" of J. G. Ameen et al., and assigned to the same asignee as the present invention, describes structures having an electronic device mounted on a flip-chip configuration on a packaging substrate. Some of the structures include a polymeric material between the chip and substrate. Similar polymeric materials are used between the two electronic devices of some of the structures of the present invention.

FIELD OF THE INVENTION

The present invention generally relates to integrated circuit assemblies and, more particularly, is concerned with increasing semiconductor chip packaging density within the assembly and substantially reducing the cost of manufacture of the assembly by the fabrication of double-chip structures.

BACKGROUND ART

Integrated circuit chips, or electronic devices, are generally packaged as discrete devices as one chip per package or as part of a multi-chip hybrid circuit, or hybrid package, where a plurality of integrated circuit chips are mounted in one such package. Each hybrid package may be treated as a building block for complex electronic circuits and systems such as a general purpose digital data processing system.

A substantial part of the cost to manufacture computer systems is directly dependent upon the space occupied by the integrated circuit chips used to fabricate the systems.

Increasingly higher packaging density is required for higher performance systems to minimize signal propagation delays between chips and to improve electrical performance through reduced inductance interconnections both of which can be achieved by reducing the length of conduction paths which interconnect the chips.

Typically, an integrated circuit chip has a back face and an active face with an array of I/O terminals on the active face. The terminals are electrically connected to the circuits within the integrated circuit chip.

A commonly used arrangement for increasing chip packaging density is the mounting of a number of chips side by side on a packaging substrate with either the active or back face placed facing the substrate. The packaging substrate is typically a ceramic containing conductor patterns therein or a polymeric printed circuit board.

The packaging substrate contains conductor patterns to interconnect the chips electrically. Fabrication constraints place a limit on the minimum distance between chips. Therefore, the minimum chip-to-chip space determines the minimum conductor path interconnecting the chips and, to a major extent, the minimum propagation delay between the chips.

Another structure to increase the chip packaging density is formed by mounting or stacking one chip on top of another chip rather than placing chips side by side.

Prior art shows examples of stacking chips to form double-chip structures. In some cases, chips are contained within a rigid housing with the back of one chip facing the back of the second chip, there being a rigid support between the chips on which the back of each chip rests. The active faces are directed away from each other to permit easy electrical connection to the exposed input/output (I/O) terminals on each chip. U.S. Pat. No. 4,288,841 to Gogal and U.S. Pat. No. 4,423,468 to Gattoctal describe structures of this type wherein one end of a wire is bonded to a chip I/O pad and the other end of the wire is bonded to a contact pad within the rigid housing.

In another type of double-chip structure, the back of one chip is placed facing the active face of the second chip. Both chips are held in place by the package housing. Electrical connection is made to each chip separately by bonding one end of a wire to a contact pad on the chip and bonding the other end of the wire to pads within the housing or to ends of a lead frame which project outwardly from the housing. Examples of these types of structures are described in PCT patent application to Motorola, Inc. PCT/FR83/00214 (published May 9, 1985, Publication No. WO 85/02060) and in Japanese patent 56-62350 to Hitachi Seisakusho K. K.

In another type of double-chip structure, the active face of a chip is placed facing the active face of a second chip. This type of structure is shown in Japanese patent 56-24955 of Fujitsu K. K. The back of a first chip is mounted onto a first substrate. Wires are bonded between the chip I/O terminals and metal patterns on the substrate. A second combination of chip on substrate is formed. The two combinations are mounted together with the active face of the chips facing each other. The substrates are held together by rigid supports, there being a space between the active faces of each chip.

Another double-chip structure having the active faces of the chips facing each other is described in Japanese patent 56-137665 to Cho Lsi Gijustsu Kendyu Kumai which is a DIP type module containing therein two semiconductor chips having solder mounds on their active faces for electrical connection to the circuits within the chips. The active faces of the chips are mounted facing each other with the solder mounds on one chip aligned with respective solder mounds on the other chip. The inner ends of a plurality of beam leads are aligned with the aligned solder mounds on each chip and soldered between the solder mounds. The double-chip combination is enclosed within a thick polymer enclosure through which the beam leads project.

In an article entitled "NEC Lamination Method Bonds Chips Face To Face" in the J. Electronic Engineering, February 1985, p. 20 there is a brief description of a laminate process that puts two conventionally made chips face-to-face and bonds them under 300 degrees centigrade to 400 degrees centigrade and pressure to form a double layered, three-dimensional device which has a contact pad on one chip thermocompression bonded to a contact pad on the other chip. Polymide, prepared as a passivating layer on the active face of each chip, surrounds the contact pads and fills the space between the active faces of the chips. There are no leads projecting outwardly from between the chips.

U.S. Pat. Ser. No. 4,585,157 to Belcher describes a double-chip structure wherein the active face of one chip is placed facing the active face of a second larger chip. Beam leads electrically interconnect the chips and provide the means for external electrical connection to the double-chip structure. The structure is formed by first thermocompression bonding the inner ends of beam leads to contact pads on the active face of the smaller chip. The beam leads project outwardly away from the smaller chip periphery. The active face of the larger chip is placed facing the active face of the smaller chip. The part of the beam lead projecting beyond the smaller chip periphery is thermocompression bonded to contact pads on the larger chip, thereby electrically connecting a contact pad on the smaller chip to a contact pad on the larger chip. The outer end of the beam lead projects outwardly beyond the periphery of the larger chip.

An invention described herein is a double-chip structure having the chips face-to-face with beam leads solderlessly bonded between contact metallurgical patterns on each chip. Although it is commonly known to solderlessly bond beam leads to contact pads on a single chip, the prior art does not teach or suggest solderlessly bonding beam leads between contact pads of a double-chip structure. Quite surprisingly, it has been found that such a double-chip structure can be formed by aligning the contact pads on each chip with beam lead ends therebetween and pressing the chips together providing heat to the back of the chips to bond, simultaneously and solderlessly, the beam lead end to both contact pads.

The structure of the present invention is similar to that of Japanese patent 56-137665 described above. The difference being that in the structure of the present invention beam leads are solderlessly bonded between contact pad whereas in Japanese patent No. 56-137665, the beam leads are solder bonded between contact pads.

For a structure having beam leads solder bonded between contact pads, the alignment of the solderable contact pads on each chip with beam lead ends therebetween is substantially easier than the alignment of solderless contact pads with the beam leads therebetween. The solder bonded double-chip structure is formed by aligning the solder coated contact pads on the first and second chip with ILB ends of the beam leads pressed therebetween. The ILB ends have a solder wettable surface. The aligned chips and beam leads are heated to a temperature to reflow the solder. The reflowed solder beads up on the solder wettable surface because of surface tension at the molten solder surface. If there is misalignment between the contact pads and the beam leads, the surface tension of the molten solder tends to pull the solder coated pads and beam leads into alignment. It is only necessary that the molten solder mounds on each chip contact the beam lead end which has a solder wettable surface for this self alignment to occur. On the other hand, for a solderless bond of a beam lead end between contact pads on two chips, there is no self alignment mechanism. If there is enough misalignment between each contact pad and the beam lead therebetween, when the contact pads are pressed towards each other to compress the beam lead an effective and reliable solderless bond will not be formed.

A solderless bond, however, has substantial advantage over a solder bond. A solder bond is intrinsically weak and has a low melting point. During the operation of the devices of the double device structure, power is dissipated which can heat the structure from room temperature to as high as 120° C. The devices are cycled many times between low and high temperature. This cycling generates stress in the solder mound causing it to deform which can result in a part of the solder mound slipping or sliding relative to the remainder of the mound causing a crack to form in the mound. Further, temperature cycling can cause the crack to propagate resulting in a failure of the electrical connection of the beam lead to the contact pad. On the other hand, a solderless bond is not subject to this type of deformation. In the solderless bond of the present invention, temperature cycling induced stresses result in elastic deformation of the contact pad and beam lead ends. The elastically deformed solderless bonds do not show the cracking degradation which occurs on the solder bond structure.

State of the art IC chips useful to practice the present invention can have as many as 400 I/O, each I/O having a 1 mil dimension with a 2 mil pitch. State of the art beam leads also have an ILB dimension as small as 1 mil with a 2 mil pitch. For a cost efficient high volume manufacture of the solderlessly bonded double-device structures of the present invention which have a high I/O count and small and closely spaced contact pads and beam lead ILB ends, the bonding must be done rapidly with a highly reliable interconnection of the beam leads to the contact pads.

Quite surprisingly, it has been found that the solderlessly bonded double-device structures of the present invention can be made with high manufacturing throughput and a solderless interconnection having high reliability.

It is therefore an object of this invention to provide an improved double-device structure wherein beam leads are solderlessly bonded between contact metallurgical patterns on each chip of a double-device structure wherein the leads project outwardly from between the two devices. Each device can be an IC chip or one device can be an IC chip and the other a device containing decoupling capacitors. The contact metallurgical patterns on the active faces of the devices in some applications are electrically connected to device I/O terminals, in other applications, as described hereinbelow, they are not.

In fabricating hybrid packages, an approach that lends itself to automating the process of mounting leads to a double-device structure is through the use of a manufacturing format known as tape automated bonding (TAB) tape. The TAB tape provides the beam leads which project outwardly from between the chips. The beam leads provide a means for externally electrically connecting the double-device structure to a substrate on which the double-device structure is mounted.

A TAB tape has a spaced series of sets of beam lead patterns. It is common in the art to use TAB tape in an automated process to bond a plurality of beam leads simultaneously to I/O terminals in a single chip active face. Each beam lead has an inner lead bond (ILB) site at one end and an outer lead bond (OLB) site at the other end. The inner lead bond sites are bonded to the chip I/O terminals.

In an invention described herein, ILB ends of a beam lead set are aligned respectively with contact metallurgical patterns on the first device. A second chip is placed facing the first chip active face. The I/O terminals or contact pads on the second chip are aligned respectively with ILB ends of the beam lead set of the TAB tape. The ILB end of the beam leads are bonded between the terminals or contact pads of the first and second chip. Therefore, a TAB tape is fabricated having two chips bonded to the beam leads of each beam lead set. The beam leads at each beam lead set project outwardly from between the two chips.

It is therefore another object of this invention to provide an improved tape automated bonding structure having a double-chip structure formed at each set of a spaced series of sets of beam lead patterns on a tape automated bonding tape.

SUMMARY OF THE INVENTION

In its broadest aspect, this invention is an improved electronic device assembly having a first and second electronic device, each device having an active face and a back face. At least the active face of each device has at the surface a plurality of terminals and a conducting pattern which can be electrically connected to the I/O terminals. The first and second devices are placed together with the active face of the first device facing the active face of the second divice. In this configuration, parts of the conducting pattern on the first device align with parts of the conducting pattern on the second device. There are interconnection means for electrically interconnecting at least a portion of the conducting patterns on the first device which are aligned to parts of the conducting patterns on the second device. The interconnection means is formed from the inner end of a beam lead solderlessly bonded between the aligned conducting patterns of the first and second device. The beam leads project outwardly from between the two devices where the metallurgical pattern on the first device is electrically connected to an I/O terminal on the first device and where the conducting pattern on the second device is electrically connected to an I/O terminal on the second device. The interconnection means electrically interconnects I/O terminals of the first and second device where the conducting patterns on the first and second devices, between which the beam lead inner end is bonded, are electrically connected to an I/O terminal on the first and second devices respectively.

A more particular aspect of this invention is forming an electrically interconnected double electronic device structure with beam leads projecting outwardly from between the devices, wherein one device is an integrated circuit chip and the other device contains at least one decoupling capacitor. The terminals of the decoupling capacitor are electrically interconnected to terminals on the chip which provide power and ground to the chip. Power input terminals can be decoupled from each other and each power input terminal can be decoupled from ground.

Another more particular aspect of this invention is a structure containing TAB tape having a spaced series of beam lead sets with two devices bonded at each beam lead set. The beam leads of each set project outwardly from between the two devices. The inner lead bond end sites or each beam lead is solderlessly bonded between conducting patterns on each device.

BRIEF DESCRIPTION OF THE DRAWINGS

FIG. 3 schematically shows bonding two electronic devices to a beam lead carrier tape such as shown in FIG. 2.

DETAILED DESCRIPTION OF THE PREFERRED EMBODIMENT

Figure 1:
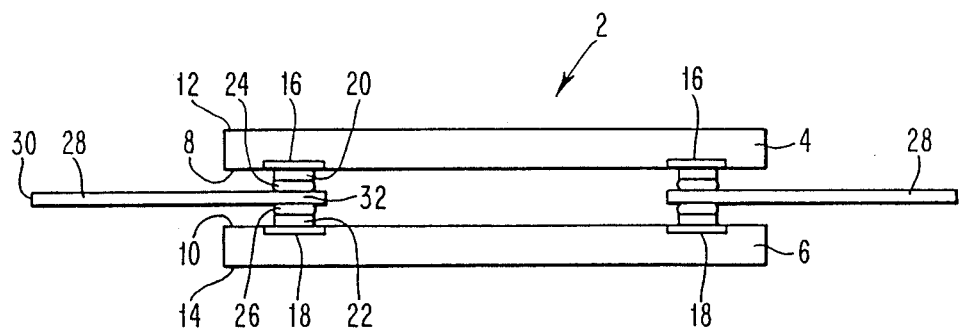
FIG. 1 shows a double electronic device structure with the active face of both devices facing each other and beam lead ends solder bonded between contact pads on each device.

FIG. 1 shows an assembly 2 made up of a two circuit carrying electronic substrates or electronic devices.

The terms electronic device and electronic substrate are used interchangeably herein. The substrates are electrically interconnected by solder. Each substrate can be a semiconductor chip or one substrate can be a semiconductor chip and the other a substrate can contain a capacitor which is used as a decoupling capacitor to capacitively decouple terminals on the semiconductor chip which carry input power to the chip and to capacitively decouple power terminals from ground. Each substrate has an active face, surface 8 for substrate 4 and surface 10 for substrate 6. Each substrate has a back face, surface 12 for substrate 4 and surface 14 for substrate 6. The circuitry contained within each substrate, which is not shown in FIG. 1, extends to the active face of each substrate. These extensions or terminals are represented by 16 at surface 8 and 18 at surface 10. A solder wettable pad 20 is formed on surface 8 in electrical connection with terminal 16 and a solder wettable pad 22 is formed on surface 10 in electrical connection with terminal 18. In general, the terminal metallurgy 16 and 18 may provide a satisfactory contact surface for bonding. In which case, separate contact pads 20 and 22 may not be necessary. The solder wettable pads are typically multi-layer structures having a bottom conductive layer which promotes adhesion between the pad and the terminals 16 and 18. The pad has a top layer of conductive material which is solder wettable, such as Au, Ag, and Ni. These materials are exemplary only and not limiting. By commonly known techniques, solder mounds 24 and 26 are placed on pads 20 and 22 respectively. Commonly used solder are Pb-Sn, Pb-In and Sn-Au. Active face 8 of substrate 4 is then held facing active face 10 of substrate 6 so that the solder mound pattern on face 8 is aligned with the solder mound pattern on face 10. By design, a preselected terminal on substrate 4 is to be electrically connected to a terminal on substrate 6. To achieve this, the terminal patterns and the contact pads and solder mounds on substrates 4 and 6 are designed so that when the active faces of each substrate are placed facing each other, the solder mounds electrically connected to terminals to be electrically connected can be aligned with respect to each other. A solder mound can be electrically connected to a contact pad on one chip which is not electrically connected to an I/O terminal and a solder mound can be electrically connected to a contact pad on the second chip which is electrically connected to an I/O terminal on the second chip. This arrangement is used where an I/O of the second chip is not intended to be electrically connected to an I/O on the first chip. Structures using contact pads which are not electrically connected to I/O are described herein below with reference to FIG. 11, 12, 13 and 14. The contact pads and solder mounds provide the means to electrically interconnect the terminals. A beam lead 28 having an inner lead bond (ILB) end 32 and an outer lead bond (OLB) end 30 provides a means for external electrical connection to the electrically interconnected substrates 4 and 6. The ILB end 32 is aligned between solder mounds 24 and 26. The assembly of substrates with aligned beam leads is placed into a reflow furnace in which the assembly is heated to a high enough temperature to melt the solder mounds 24 and 26. The ILB end is coated with a solder wettable conducting material such as Au, Cu, Sn, and Ni. These materials are exemplary only and not limiting. The molten solder wets the ILB end. The assembly is cooled to solidify the solder to leave the two substrates electrically interconnected with a beam lead soldered to the electrical interconnections and projecting outwardly from between the two substrates. Depending on the relative size of the solder mounds as compared to the beam lead width, the final solder interconnection can be a solder column into which the beam lead is embedded or a distinct solder mound can rest on opposite sides of the beam lead.

The beam leads can be provided by several types of metalized carrier tapes which are commonly used in the art. These types have a spaced series of beam lead patterns thereon.

Figure 2:
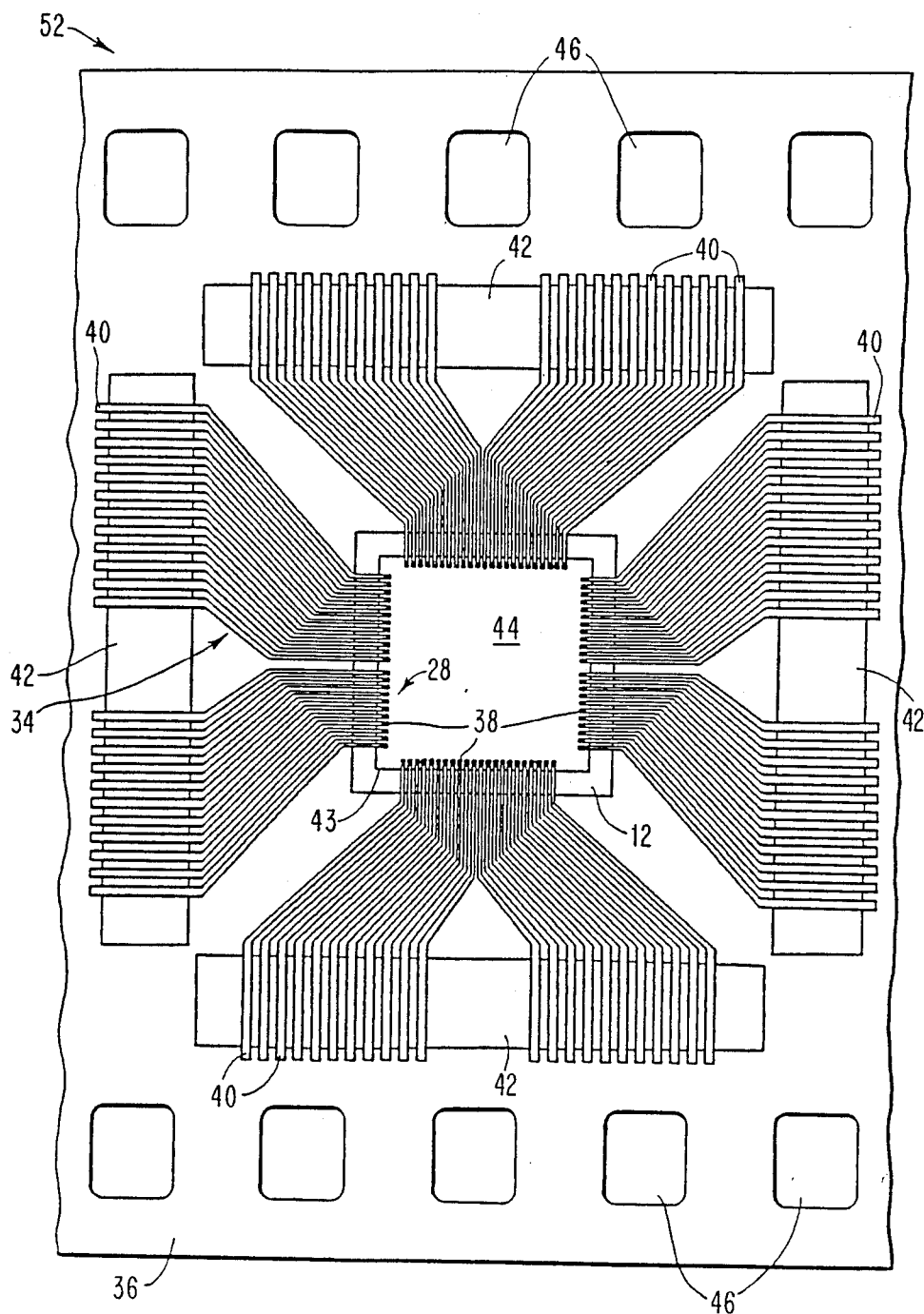
FIG. 2 shows one set of beam leads on a segment of a TAB carrier tape.

FIG. 2 shows one set of beam leads represented by 34 formed on a flexible film 36. Each beam lead has an ILB end 38 and an OLB end 40. The ILB ends project inwardly towards a central location and are bonded to contact pads on an electronic device represented by 43. For the tape shown in FIG. 2, the ILB ends project inwardly in cantilevered fashion over the edge 42 of aperture 44 in tape 36. At the OLB ends, the beam leads project over apertures 42. Aperture 42 provides an opening in the film 36 to form bonds at the OLB ends. Flexible film 36 has a series of sprocket holes 46 at the outer edges of the film. These sprocket holes permit alignment of the beam leads to the substrates to which both the ILB and OLB ends will be electrically connected. Generally, the sprocket holes permit only a coarse alignment of the ILB and OLB ends to contact pads on a chip and substrate respectively. Commonly used optic systems are used to provide fine alignments of ILB ends to contact pads on a chip.

FIG. 2 is an example of one type of metalized carrier for a spaced series of groups of beam leads. Another commonly used beam lead carrier has only one layer of metal in which a series of beam lead patterns are formed. The beam leads and the metal film are a unitary structure. The beam leads are formed by etching the beam lead patterns in the tape. Alternatively, the leads may be pattern plated using photolithographic processes.

After a semiconductor chip is bonded to the ILB ends of the beam leads, the leads are severed, by methods commonly used in the art, from the metalized film in the region of the OLB ends in the region of aperture 42 in FIG. 2.

State of the art TAB tape provides beam lead patterns which have ILB end dimensions as small as 1 mil with a ILB pitch of 2 mils. Therefore, TAB tape permits fabrication of double-chip structures wherein the chips have contact pads having 1 mil dimensions with a pad-to-pad pitch of 2 mils.

FIG. 3 schematically shows a film with a spaced series of sets of beam lead patterns thereon being used in an automated process for simultaneously electrically connecting two semiconductor chips. Wound on reel 48 is a metalized carrier 50 containing a spaced series of sets of beam lead patterns thereon, represented in FIG. 3 by 52. The film is fed by a sprocket feed means represented by 58 and 60. The sprocket feed means have teeth which mesh with the sprocket holes 46 of FIG. 2. The film is fed between fixtures 62 and 64. Fixture 62 has a semiconductor chip 66 held thereon with the chip's active face placed facing film 50. The ILB ends of the beam leads of lead set 68 are aligned with the contact pads, such as solder coated pads, on the active face of chip 66. Systems, such as optical systems, for aligning contact pads to beam leads are commonly used in the art. After beam lead set 68 is aligned to chip 66, fixture 64 which holds the active face of chip 70 facing downwardly towards film 50 is positioned to align contact pads, such as solder coated pads, on chip 70 to the inner lead bond ends of lead set 68. A means by which fixture 64 can hold a chip downwardly facing is a commonly used vacuum pickup, in the fixture 64, which is not showing in the figure. Fixtures 62 and 64 are moved towards carrier 50 to press the contact pads on chip 70 and chip 66 together with the ILB ends of lead set 68 between each ILB end's respective contact pads. Fixtures 62 and 64 may be contained within a solder reflow furnace schematically represented by 72. The temperature within the reflow furnace is heated above the melting temperature of the solder, e.g., 312° C. for 95/5 Pb/Sn solder and above 183° C. for 37/63 solder. The chips and leads are cooled, the solder solidifies and chips 70 and 66 are bonded to lead set 68. Fixtures 64 and 62 are then pulled away from film 50. The film is advanced by the sprocket means such as 58 and 60. One assembly of two chips 70' and 66' bound to lead frame 68' is schematically shown in FIG. 3. The film with a spaced series of assemblies is then wound up on reel 74. Solder bonding two chips to a spaced series of beam leads on a TAB tape is not the preferred embodiment of this invention. The preferred embodiment, described below, is to solderlessly bond the chips to the beam leads. Solder bonding requires either (1) aligning the chips to the beam leads outside the solder furnace clipping them together to hold them in place and aligned to the beam leads and then feeding the clipped assembly into the furnace to reflow the solder or (2) aligning the chips to the beam leads in the furnace and heating to reflow the solder which requires an alignment system which can withstand the temperature cycling from room temperature to the reflow temperature. Solderless bonding avoids these complications providing a substantially simpler process and less costly structure.

Figure 4:
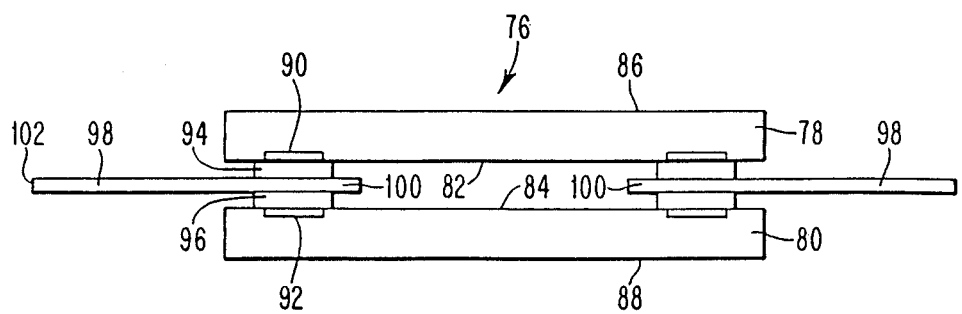
FIG. 4 shows a double electronic device structure with the active face of both chips facing each other and beam lead ends solderlessly bonded between contact pads on each device.

FIG. 4 shows another embodiment of a double substrate assembly 76 wherein beam leads are solderlessly bonded to contact pads on the substrates. Each substrate 78 and 80 can be any type of circuit carrying substrate such as, for example, a semiconductor chip, a ceramic substrate having metal circuit patterns therein and a substrate containing one or more capacitors which are used as a decoupling capacitor to capacitively decouple terminals on a semiconductor which carry input power to the chip or to decouple a terminal carrying input power from a ground terminal. Substrate 78 has an active face 82. Substrate 80 has an active face 84. Substrate 78 has a back face 86 and substrate 80 has a back face 88. These extensions or terminals are represented by 90 on substrate 78 and 92 on substrate 80. A contact pad 94 is formed on substrate 78 in electrical connection to terminal 90. A contact pad 96 is formed on substrate 80 in electrical connection to terminal 92. The contact pads are typically multi-layer structures having a bottom adhesion layer such as Ti or Cr to promote adhesion of the pad to the chip terminal. The top layer of the pad is a commonly known solderless bondable layer such as Au, Sn, Cu, or Ni. Between the adhesion and bonding layer there is typically a thick conducting layer of a metal such as Cu, Al, Au, Ag or alloys thereof. These materials are exemplary only and not limiting. As with the structure of FIG. 1, by design a preselected terminal on substrate 78 is to be electrically connected to a terminal on substrate 80. To achieve this, the terminal patterns and the contact pads on substrates 78 and 80 are designed so that when the active faces of each substrate are placed facing each other, contact pads which are to be electrically connected can be aligned with respect to each other. Beam leads 98 formed from conducting material such as Cu, Al, Au having an ILB end 100 and an OLB end 102 provide a means for external electrical connection to the substrates 78 and 80. ILB end 100 is placed between aligned pads 94 and 96. The ILB end 100 is coated with a conducting material, such as Au, Cu, Ni or Sn, which will solderlessly bond to contact pads 94 and 96, such as, for example, by thermocompression bonding or ultrasonic bonding. These materials are exemplary only and not limiting. The ILB end 100 bonded to and between each pad 94 and 96 forms the electrical interconnection means between terminals 92 and 90. Contact pad structures useful to form solderless bonds to beam leads are described in copending U.S. application Ser. No. 06/895,092 filed August 11, 1986 entitled "Aluminum Bump, Reworkable Bump, and Titanium Nitride Structure for TAB Bonding" to Bickford et al which is incorporated herein by reference.

The contact pad structure described therein have a total thickness of from about 8 to about 27 microns. The predominant component of these structures is an Al layer of from about 7 to about 25 microns.

For effective solderless bonding to occur for the type structure shown in FIG. 4, the contact pad must be deformed from about 20% to about 50%. Thirty percent is the preferred degree of deformation. This deformation sufficiently presses the beam lead into the pad to form a strong low contact resistance solderless bond. The beam lead thickness is from about 8 to about 80 microns with a preferred thickness of 34 microns.

Figure 5:
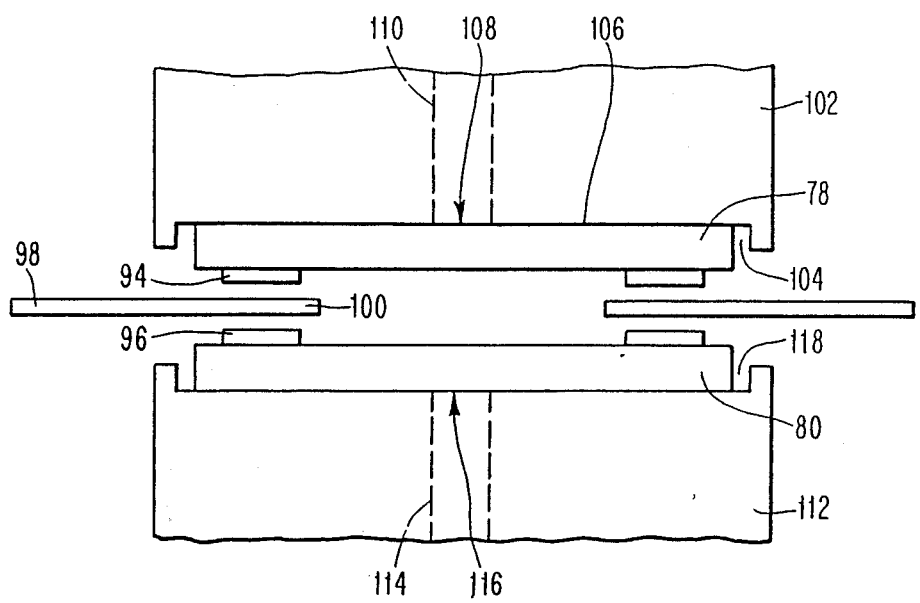
FIG. 5 schematically shows a tool holding two electronic devices with beam leads therebetween for electrical bonding to contact pads on the two chips.

FIG. 5 shows a schematic diagram of simultaneously thermocompression bonding ILB ends 100 to pads 94 and 96. Fixture 102 holds chip 78 in well 104 of fixture 102. At the base, 106 of well 104 there is a vacuum port 108 connected to cavity 110 in fixture 102. A vacuum is applied through cavity 110 holding the chip in place at port 108. A similar arrangement holds chip 80 in fixture 112 by a vacuum applied through cavity 114 to port 116 in base of well 118 in fixture 112 in which chip 80 rests. Fixture 102 (or 112) is aligned to beam leads 98 so that pads 94 of chip 78 align to their respective ILB ends. Fixture 112 (or 102) is aligned to the previously aligned beam lead and chip combination. The alignment of beam leads and chip can be done with commonly used split beam optic systems or other vision system. Fixture 102 and 112 have a means for heating the fixture such as, for example, a heating coil or cartridge heater. Fixtures 102 and 112 are moved together. Contact pads 94 and 96 are pressed together with ILB ends 100 therebetween. The fixtures are heated to a high enough temperature, and the fixtures are pressed together with sufficient pressure to form a thermocompression bond of ILB end 100 to both pads 94 and 96. Quite surprisingly, it has been found that sufficient heat can be transported through a semiconductor chip of approximately 10 to 100 mils thickness to contact pads such as 94 and 96 to form thermocompression bonds with ILB end 100. Therefore, it is unnecessary to heat the entire combination of the two chips aligned to the beam leads.

It is only necessary that a thermal cycle be used which is long enough to allow at least the contact pad to warm up to about 350° C. to 450° C. to form a low contact resistance solderless bond.

The thermocompression bonding apparatus schematically shown in FIG. 5 is exemplary only and not limiting. This apparatus can be incorporated in an automated process of simultaneously thermocompression bonding two chips to a set of beam leads on a tape having a series of sets of beam leads or lead frames by substituting the apparatus of FIG. 5 for the bonding fixtures contained within region 72 of FIG. 3. Since the two chips can be simultaneously bonded to the beam leads simply by providing heat to the back face of the chips, the additional complexity referred to above to solder bond the ILB ends of the beam leads to contact pads on the chip can be avoided.

Figure 6:
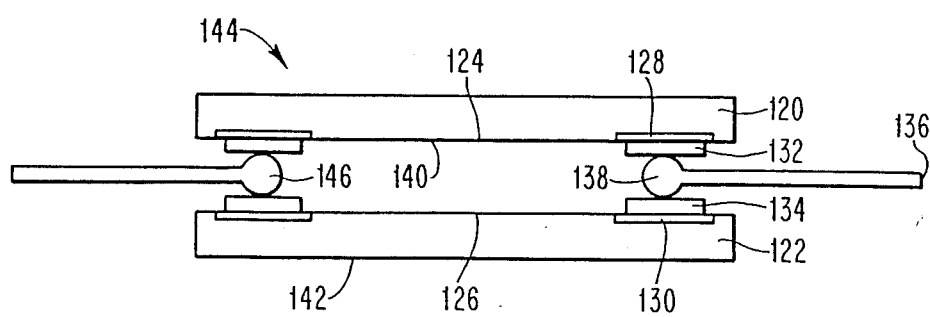
FIG. 6 shows a double electronic device structure with the active faces of both devices facing each other and beam lead ends having rounded protuberances at the ends solderlessly bonded between contact pads on each device.

Another embodiment of a double substrate structure wherein two substrates are electrically interconnected by solderless bond means at the ILB end of beam leads is shown in FIG. 6. Each substrate 120 and 122 can be any type of circuit carrying substrate, such as for example a semiconductor chip, a ceramic substrate having metal circuit patterns therein and a substrate containing a decoupling capacitor. As with FIG. 4, substrates 120 and 122 have active face 124 and 126 respectively with extensions or terminals 128 on substrate 120 and extensions or terminals 130 on substrate 122. Optional contact pad 132 rests on and is in electrical connection with terminal 128. Optional contact pad 134 rests on and is in electrical connection with terminal 130.

As with the structures of FIG. 1 and FIG. 4, by design a preselected terminal on substrate 120 is to be electrically connected to a preselected terminal on substrate 122. To achieve this, the terminal patterns and the contact pads on substrates 120 and 122 are designed so that when the active faces of each substrate are placed facing each other, contact pads which are to be electrically connected can be aligned with respect to each other. Beam lead 134 has an OLB end 136 and an ILB end 138. At the ILB end 138 there is formed a protuberance 146, shown as a spherical shape. Contact pads 132 and 134 are both solderlessly bonded to protuberance 146 which is between pads 132 and 134. The ILB end with the protuberance is typically coated with a material such as Cu, Au or Sn, which will solderlessly bond to contact pads 132 and 134 which typically have a top surface such as Au, Cu or Sn to which a solderless bond will form.

An ILB site of a beam lead can be electrically connected to a contact pad on one chip which is not electrically connected to an I/O terminal and the ILB end can be electrically connected to a contact pad on the second chip which is electrically connected to an I/O terminal on the second chip. This arrangement is used where the I/O of the second chip is not intended to be electrically connected to an I/O on the first chip.

The processes for forming such protuberances on beam lead ends and structure incorporating beam leads with protuberances are described in copending U.S. patent application Ser. No. 06/857,227 filed April 27, 1986 to Hodgson et al which is assigned to IBM. The Hodgson et al patent application is incorporated herein by reference.

In the Hodgson et al application, one method to form protuberances on the end of beam leads is by an arc process. The beam lead ends are heated with an arc in a reducing atmosphere. The reducing atmosphere is used to reduce oxygen from the leads on which the protuberances are formed.

Another method described in the Hodgson et al application for forming protuberances at beam lead ends is by focusing a laser beam on the beam lead ends to melt the ends so that surface tension forces form a spherical protuberance at the beam lead end. U.S. Pat. No. 4,587,395 to Oakley et al describes a process for forming a protuberance at beam lead ends by using a focused laser beam.

The use of beam leads with protuberances at the ILB end permit the use of thinner contact pads 132 and 134 in FIG. 6 than the corresponding contact pads 90 and 92 in the embodiment of FIG. 4 where the ILB ends do not have protuberances. The contact pad can have the same metallurgical structure as the pads of FIG. 4 with a thickness of from about 0.5 to about 5 microns with a preferred thickness of about 2 microns. The use of beam leads with protuberances at the ILB ends may also allow the elimination of contact pads 132 and 134 in FIG. 6.

For effective solderless bonding to occur for the type structure shown in FIG. 6, the protuberance must be deformed from about 20% to about 50%. Thirty percent is the preferred degree of deformation. This deformation sufficiently presses the pads into the protuberance to form a strong low contact resistance solderless bond. For a spherical protuberance the protuberance radius is from about 8 to about 80 microns with a preferred radius of about 34 microns.

The assembly 144 of FIG. 6 can be solderlessly bonded in a similar manner as described with reference to FIG. 5. The substrates 78 and 80 and the beam leads can be replaced by substrates 120 and 122 and beam leads 134 of FIG. 6. An automated bonding process such as shown and described with reference to FIG. 3 can be used to simultaneously thermocompression bond contact pads on substrates 120 and 122 to protuberance 146 at ILB end 138. To achieve this, the tape 50 of FIG. 3 contains thereon a spaced series of beam lead sets 52 of FIG. 3 one of which is shown in detail in FIG. 2. The beam lead ends 38 of FIG. 2 have protuberances thereat as shown in FIG. 6 as 146 and 138.

Figure 7:
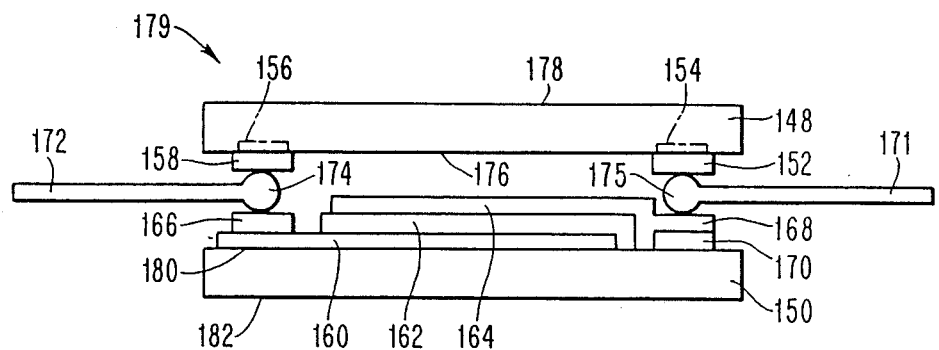
FIG. 7 shows a double electronic device structure similar to that of FIG. 6 wherein one device is a capacitor.

FIG. 7 shows an embodiment of a double substrate structure wherein one of the substrates is a semiconductor chip 148 and the other substrate 150 contains a decoupling capacitor. In FIG. 7, the means electrically interconnecting the two substrates is that shown in and described with reference to FIG. 6. The semiconductor chip has optional contact pads, two of which are shown as 152 and 158, in electrical connection with terminals 154 and 156 respectively on the semiconductor chip 148. Substrate 150 can be any carrier material such as a ceramic, a glass ceramic, quartz, sapphire, silicon, metal or polymer. The capacitor on substrate 150 may be formed, for example from a first metal layer 160, a dielectric layer 162 and a second metal layer 164. The contact pads of substrate 150 are 166 and 168. Pad 168 is an extension of metal layer 164. Below pad 168 is a metal layer 170 which may be formed from the same metal deposition as layer 160. The substrate electrical interconnection means is the same as shown in and described with reference to FIG. 6. Beam lead 172 has a rounded protuberance 174 as its ILB end which is solderlessly bonded to contact pads 158 and 166 and lying between these pads. Similarly, there is a protuberance 175, at the ILB end of beam lead 171, which is solderlessly bonded between pads 152 and 168. The substrate electrical interconnection means can be the solderless structure shown in and described with reference to FIG. 4 or the solder structure shown in and described with reference to FIG. 1.

The terminals 156 and 154 are electrically connected to conducting lines within the chip 148 which the capacitor on substrate 150 is to decouple. Typically, power distribution lines and planes are decoupled from each other and power distribution lines and planes are decoupled from ground. Therefore, terminals 156 and 154 can be electrically coupled to any combination of terminals on chip 148 which carry power to the chip or provide a ground terminal to the chip. The beam leads such as 172 and 171, which are electrically connected to the power input terminals or ground terminals such as 156 and 154, provide the power input and ground to assembly 179. The substrate 150 can contain more than one decoupling capacitor each having its own terminals to permit decoupling of different power input terminals from each other and to decouple each power input from ground.

The capacitor structure of FIG. 7 can be fabricated by commonly known metal deposition, photolithographic, additive and substractive processes.

The decoupling capacitor shown in FIG. 7 is an example only and is not limiting. Any other decoupling capacitor structure which can be formed on or in the substrate 150 can be used. For example, if the substrate 150 is a semiconductor chip, the capacitor can be formed from a PN junction or from a MOS structure both of which are commonly known in the art.

Figure 8:
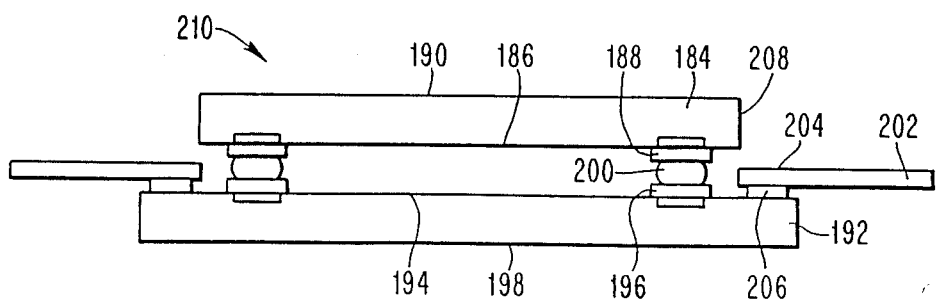
FIG. 8 shows a double electronic device structure wherein the devices are electrically interconnected by solder mounds and beam leads are electrically connected to pads on one device.

FIG. 8 shows another embodiment 210 of a double substrate structure. FIG. 8 will be described in terms of the substrates being semiconductor chips. This is exemplary only and not limiting. Semiconductor chip 184 has an active face 186 with contact pads 188 thereon and a back face 190. Semiconductor chip 192 has an active face 194 with contact pads thereon and a back face 198. Chip 192 has two sets of contact pads, an inner set represented by 196 and another set represented by 206. The active face area of chip 192 is larger than the active face area of chip 184. As with FIG. 1, 4, 6 and 7, the contact pads on chip 184 and the inner contact pads on chip 192 are designed so that when the active face 186 and 194 are disposed facing each other, contact pads which are to be electrically interconnected are aligned. Solder mound 200 is used for electrically interconnecting pad 188 to pad 196. When the chips 184 and 192 are aligned, outer contact pads 206 on chip 192 sit beyond the periphery 208 of chip 184. Beam lead 202 has an ILB end 204 and an OLB end 206. ILB end 204 can be electrically bonded to chip 192 outer contact pads 206 either by solderless bonding or by solder bonding. This bonding step may precede or follow the chip-to-chip bonding step.

In a double substrate structure composed of two different semiconductor chips, such as a memory and logic chip or two different memory chips or two different logic chips, the chips can be designed so that when the active faces are placed facing each other, contact pads to be electrically interconnected are properly aligned. On the other hand, if two identical chips, in particular memory chips, are used to form a double chip structure when the chip active faces are placed facing each other, in general, all terminals which are to be electrically interconnected will not be aligned and terminals which are not to be electrically connected can be aligned. This situation will arise when a double dense memory is formed from a double chip structure composed of two identical memory chips.

Figure 9:
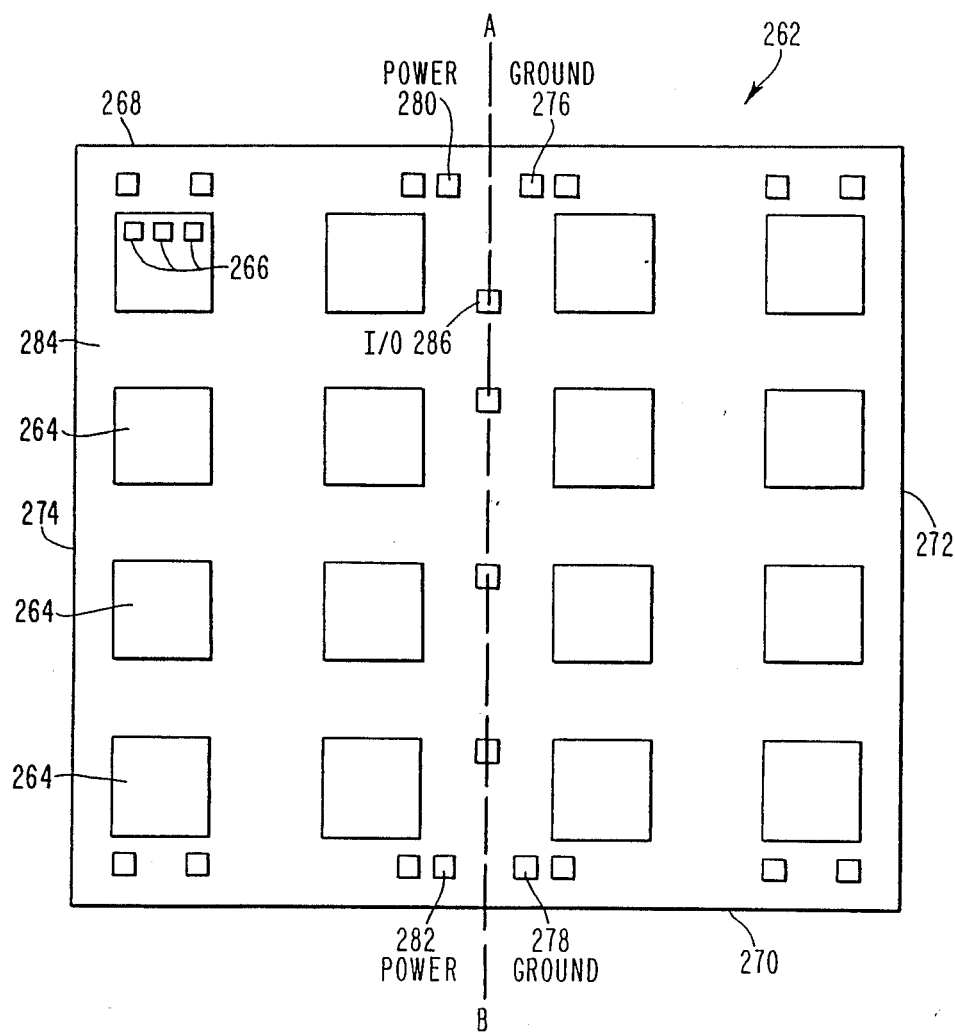
FIG. 9 schematically shows a semiconductor memory chip.
Figure 15:
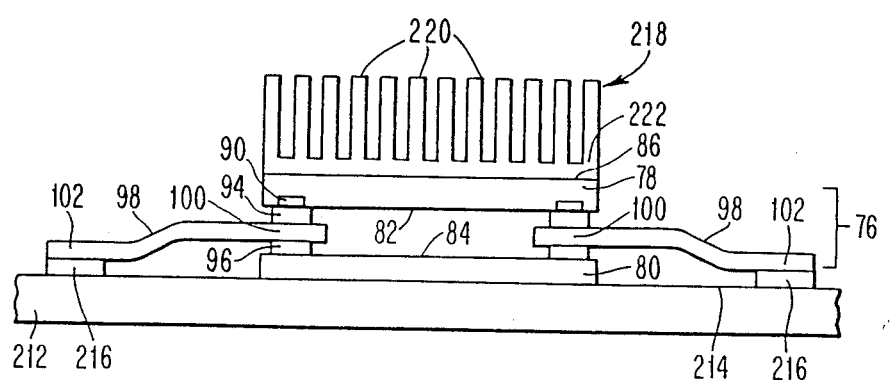
FIG. 15 shows a double electronic device structure with a finned heat dissipation structure on the back of one device, the assembly being mounted to a substrate.

FIG. 1, 4 and 6 show embodiments of a double substrate structure each using a different means to electrically interconnect a pad on one substrate which is aligned with a pad on the other substrate. In general, when the active face of one substrate is placed facing the active face of the second substrate, a contact pad on one face which is aligned with a contact pad on the second face may not be aligned to contact pads which are intended to be electrically interconnected by the solder bonds of FIG. 1 or the solderless bond structures of FIG. 4 and 6. FIG. 9 shows a schematic diagram of typical semiconductor memory chip 262 having a number of regions 264 each of which contains a number of memory cells, three of which are schematically shown as 266. Regions on the chip external to regions 264 contain word lines and bit lines which generally are straight conducting lines, the bit lines running in a direction perpendicular to word lines. The bit lines and word lines are generally on different layers of conducting patterns, the layers being separated by insulating material. Contact pads electrically connected to the circuitry within the chip are along periphery 268 and 270 of the chip 262 and run along a line A-B which is equidistant from edges 272 and 274 of chip 262. A semiconductor chip has at least one ground pad. Two ground pads 276 and 278 are shown in FIG. 15. A semiconductor chip has power input terminals. Two power input terminals 280 and 282 are shown in FIG. 9. Current is provided at power input terminals to power up the chips and to place memory cells, such as cell 266, in a condition to store data. A memory chip must have contact pads through which data is read from or written into the cells 266. The contact pads along axis A-B can be the data input/output contact pads. One of these pads is designated as 286. The layout described for chip 262 of FIG. 9 is exemplary only and not limiting.

Figure 10:
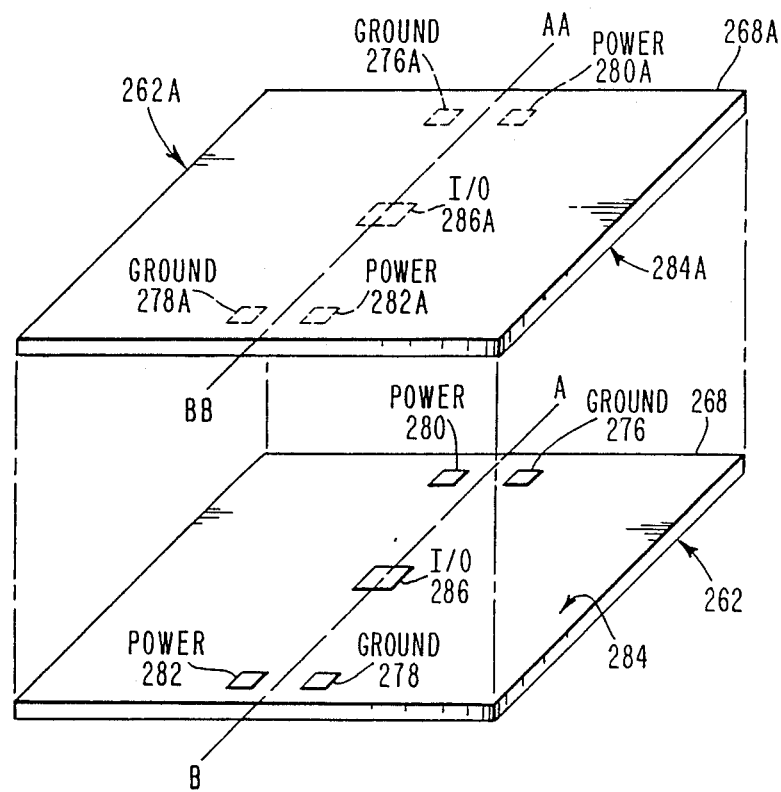
FIG. 10 schematically shows two semiconductor chips of the type shown in FIG. 9 with active faces placed facing each other with contact pads aligned.

A double-chip structure can be formed from two identical chips shown as 262 in FIG. 9. In FIG. 10, a simplified drawing of a chip such as shown in FIG. 9 is designated as 262 and its constituent elements which correspond to those in FIG. 9 as the same numbers. A second identical chip is designated as 262A. The constituent elements of chip 262A are designated by the same numbers as for chip 262 but with a suffix A. FIG. 10 shows chips 262 and 262A aligned with active faces 284 and 284A respectively placed facing each other. Contact pads on chip 262A are shown in dotted outline since they are on the active face of the chip which is not visible in the perspective of the drawing. No beam leads are shown. FIG. 10 shows how the contact pads on the chips align. A double-chip structure can be formed from chips 262 and 262A by starting with active face 284 of chip 262 and active face 284A of chip 262A facing in the same direction. Chip 262A is rotated 180 degrees about axis AA-BB and placed over chip 262 so that axis A-B is aligned with axis AA-BB and chip 262 edge 268 is aligned with chip 262 edge 268A. This results in the contact pad on chip 262 along axis A-B, such as 286, being aligned with contact pads, such as 286A on chip 262A along axis AA-BB. If an electrical interconnection means such as shown in FIG. 1, FIG. 4, or FIG. 6 is bonded between contact pads 286 and 286A, an I/O terminal of chip 262 beneath contact pad 286 will be electrically connected to an I/O terminal on chip 262A beneath contact pad 286A. This is generally not desired since a primary purpose in forming a double memory chip structure having two identical memory chips is to double the data storage capability of the location on a packaging substrate on which the structure is mounted. Also, ground pad 276A of chip 262A will be aligned with power input pad 280 of chip 262 and power input pad 280A of chip 262A will be aligned with ground pad 276 of chip 262. A similar situation occurs with respect to ground pads 278 and 278A and power pads 282 and 282A. When face 284 of chip 262 is aligned with and placed facing face 284A of chip 262A, it is desirable that ground pad 276 will be electrically interconnected with ground pad 276A and that ground pad 278 will be electrically interconnected with ground pad 278A and that power pads 280 and 282 will be electrically interconnected with power pads 280A and 282A respectively. The alignment between pads on chip 262 and 262A is indicated by dotted lines in FIG. 10.

As is commonly known in the art, integrated circuit chips have generally one or more metal layer patterns which electrically interconnect the circuits on the chip with the chip I/O. Therefore, one way to achieve this result is to design these electrical conducting layers of chip 262 and 262A differently so that the appropriate pads will be aligned. Part numbers is a commonly used terminology to refer to chip having the same electrical components in the semiconductor material but having a different conductor pattern interconnecting the components.

Requiring two part numbers to form a double-chip structure increases the cost to fabricate the double-chip structure for high volume manufacture. Two designs are required and two distinct part numbers must be manufactured. Moreover, chips having a single part number cannot generally be used to fabricate a double-chip structure because when placed in the double-chip configuration, the I/O of one chip will not properly align with the I/O of the second chip.

A single part number chip can be used to fabricate a double-chip structure by adding to the top surface of the active chip face a modified contact pad structure which is described with reference to FIG. 11, 12, 13 and 14.

Figure 11:
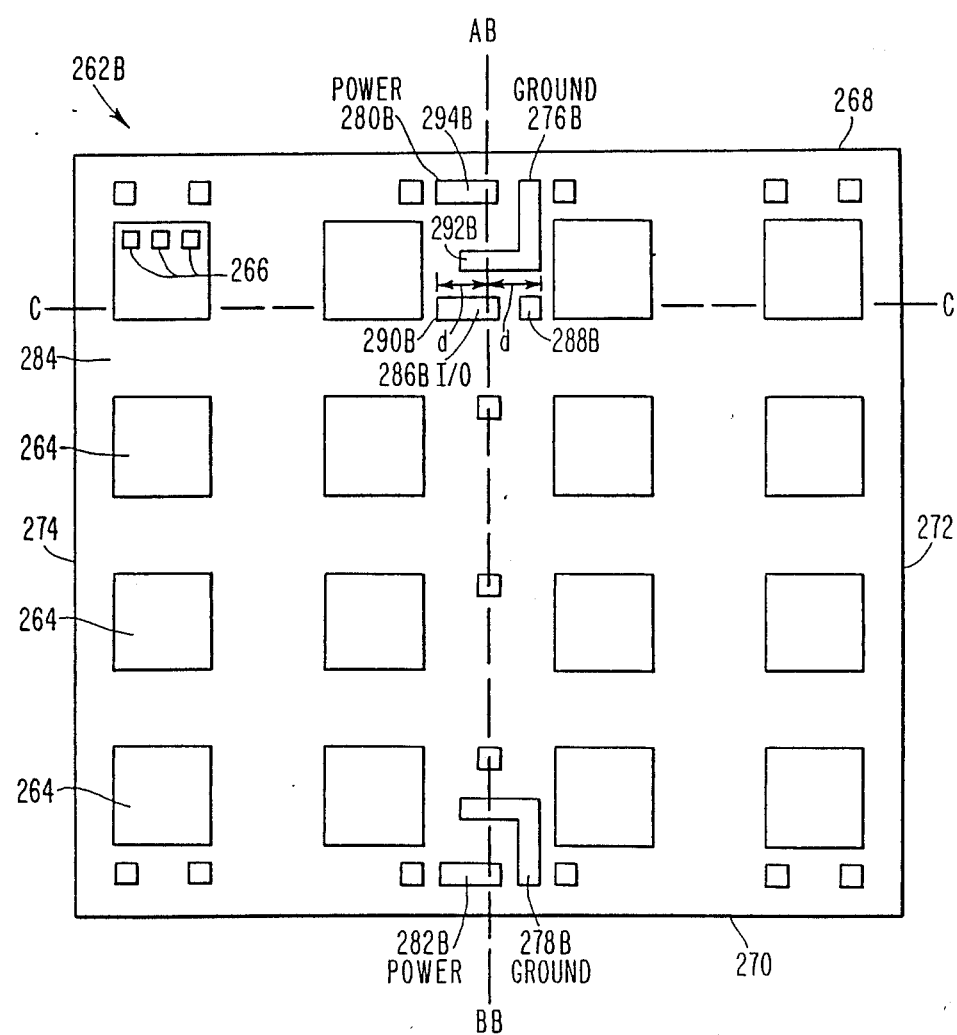
FIG. 11 shows a semiconductor chip similar to that of FIG. 9 with a modified contact metallurgy.

FIG. 11 shows a memory chip 262B similar to the chip shown in FIG. 9. However, the contact pad metallurgy corresponding to contact pads 280, 276, 282, and 286 is modified to 280B, 276B, 282B, 278B and 286B. Furthermore, contact pad 288B is added. Contact pad 288B has the approximate dimensions of the contact pads such as 286 and is spaced perpendicularly away from axis AB-BB of a chip by a distance, d, which is substantially equal to the distance that end 290B of elongated pad 286B is spaced from axis AB-BB. The reason for this will be described below.

Figure 12:
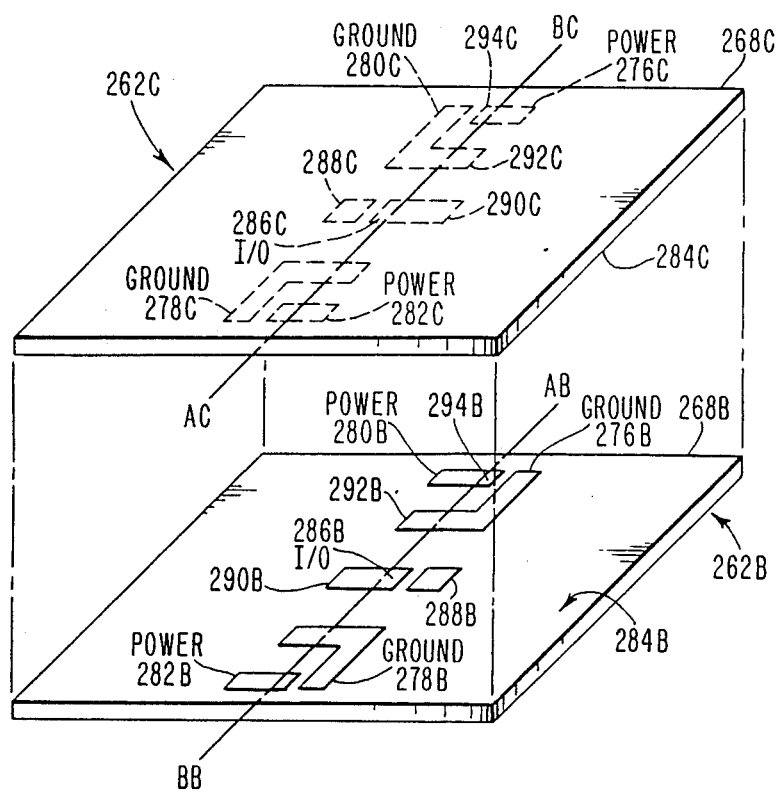
FIG. 12 schematically shows two semiconductor chips of the type shown in FIG. 11 with active faces placed facing each other with modified contact metallurgy aligned.

FIG. 12 shows two chips aligned with active faces facing each other without beam leads. A double-chip structure can be formed from two identical chips 262B and 262C each having the modified contact metallurgy indicated by the numbers with the suffix B and C. The double-chip structure of FIG. 12 can be formed from chips 262B and 262C by starting with active face 284C of chip 262C and active face 284B of chip 262B facing the same direction. Chip 262C is rotated about axis AC-BC. The axis AB-BB of chip 262B is aligned with the axis AC-BC of chip 262C. Edge 268B of chip 262B is aligned with edge 286C of chip 262C. End 294C of pad 280C which is on the axis of rotation AC-BC of chip 262C is aligned with contact end 294B of contact pad 280B of chip 262B. Thus, the power pad 280B of chip 262b can be electrically interconnected to the power pad 280C of chip 262C. Similarly, contact pad end 292B of extended contact pad 276B of chip 262B can be electrically interconnected to contact pad end 292C of extended contact pad 276C of chip 262C. Thus, ground pad 276B of the chip 262B can be electrically interconnected to the ground pad 276C of chip 262C by placing an interconnection means between the pattern extension ends 292B and 292C on the two chips.

The effect of the extended contact pads 280B and 276B is to take the contact pads 280 and 276 of chip 262 of FIG. 9 which are not on the axis of rotation A-B of chip 262 of FIG. 9 and effectively translate them to the axis of rotation AB-BB of FIG. 11 by providing an extension 292B and 294B which rests over the axis of rotation.

Figure 13:
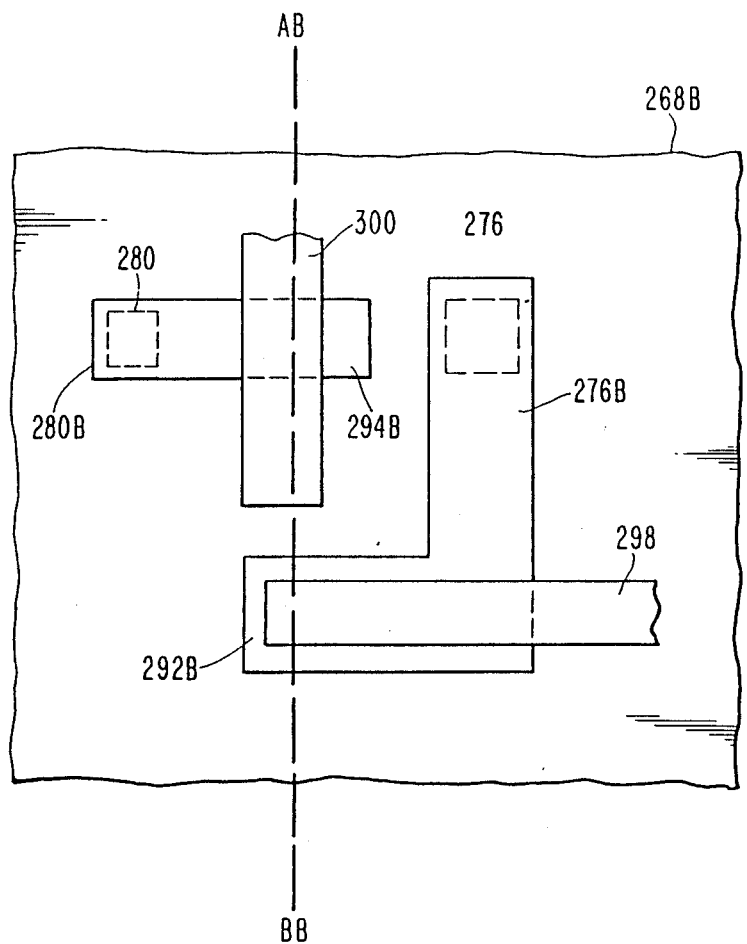
FIG. 13 shows an expanded view of modified contact metallurgy of FIG. 11.

FIG. 13 is an expanded view of the region of chip 262B in FIG. 11 surrounding contact pad 280B and 276B. The locations of pads 280 and 276 of chip 262 of FIG. 11 is shown in dotted outline. Neither pad 280 nor 276 is on the rotation axis A-B in FIG. 9. Extended pad 280B and 276B of chip 262B of FIG. 13 is shown having ends 294B and 292B respectively on the rotation axis AB-BB. The contact pad metallurgy forming pads contact on chips 262, 262A, 262B and 262C can be a metallurgy appropriate for the double-chip structures shown in FIG. 1 with solder mounds as electrical interconnection means, shown in FIG. 4 for solderless bonding and shown in FIG. 6 for solderless bonding to beam leads with rounded protuberances at the ends thereof.

In FIG. 13, beam lead 298 is shown over contact pad end 292B. Beam lead 300 is shown over contact pad end 294B. The second chip of the double-chip structure is not shown in FIG. 13. The contact pad configuration 280C and 276C of the chip 262C is a mirror image through axis AB-BB of the contact pad pattern 280B and 276B shown in FIG. 13.

Contact pad 286 of FIG. 9 which rests on axis of rotation A-B is replaced in FIG. 11 by contact pad 286B which is extended in a direction perpendicular to the axis AB-BB to provide contact pad end 290B which is not on the axis of rotation AB-BB.

Referring to FIG. 12, when the active face of a first chip 262B is aligned with and placed facing the active face of a second chip 262C, contact pad end 290B on chip 262B is aligned with contact pad end 288C of 262C chip and contact pad end 290C of chip 262C is aligned with contact pad 288B on chip 262B. Pads 288B and 288C on chip 262B and chip 262C respectively are dummy pads since they are not electrically connected to components within the chip as is shown in and described with reference to FIG. 14. Therefore, where an electrical interconnection means is placed between contact pad end 290B of chip 262B and dummy contact pad 288C chip 262C. Chips 262B and 262C are not electrically interconnected by this interconnection means.

When chips having the contact pad structure of FIG. 9 are used to form the double-chip structure of FIG. 10, I/O pads 286 of chip 262 and I/O pad 286A of chip 262A are electrically interconnected because they lie on the axis of rotation A-B. By forming extended contact pads such as 286B of FIG. 11, pads on the axis of rotation are taken off the axis of rotation.

Figure 14:
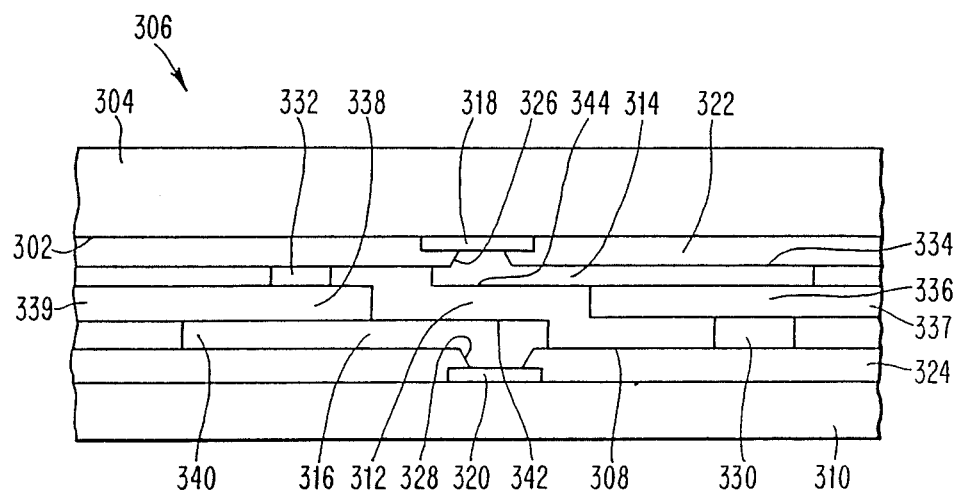
FIG. 14 shows a cross-sectional view along axis CC of FIG. 11.

FIG. 14 is a cross section along an axis CC shown in FIG. 11. FIG. 11 shows only one chip of a double-chip structure. The cross section of FIG. 14 shows a double-chip structure with active face 302 of chip 304 placed facing the active face 308 of chip 310 with beam leads therebetween. The cross sections along axis CC of FIG. 11 is through contact pads 290B and 288B of FIG. 11.

The cross section of FIG. 14 shows active face 302 of chip 304 mounted in double-chip structure 306 facing active face 308 of chip 310. Chip 304 has contact metallurgy 314 and chip 310 has contact metallurgy 316. Contact metallurgy 314 and 316 of FIG. 14 correspond to contact metallurgy 290C and 290B respectively of FIG. 12. Pad 314 is electrically interconnected to elements within chip 304 through chip conductor extension 318. Pad 316 is electrically interconnected to elements within chip 310 through chip conductor extension 320. Chip 304 and chip 310 have insulating layers 322 and 324 respectively on the chip active faces. Contact metallurgy 314 is electrically connected to extension 318 through hole 328 in layer 324. Contact pad 330 rests on insulating layer 324 and is not electrically connected to elements within chip 310. Contact pad 332 rests on insulating layer 322 and is not electrically connected to elements within chip 304. Contact pads 330 and 332 of FIG. 14 correspond to contact pads 288B and 288C respectively of FIG. 12. The electrical interconnection between contact pads on chip 304 and chip 310 is that shown in FIG. 4. However, one of skill in the art can recognize that the electrical interconnection means shown and described with reference to FIG. 1 and 6 can be used in the structure shown in FIG. 14. ILB end 336 of beam lead 337 is solderlessly bonded between pad extension 334 of pad 314 and pad 330. ILB end 338 of beam lead 339 is solderlessly bonded between pad 316 extension 340 and pad 332. In the case where the solderless bond is formed by thermocompression bonding as shown in and described with reference to FIG. 5, dummy pad 330 provides a structure for compressing ILB end of beam lead 336 against the extension 334 of contact pad 314. Also, bonding beam lead ends between active and dummy pads adds structural stability to the double-chip structure. The same applies with respect to dummy contact pad 332, ILB end 333 of beam lead 339 and contact pad 316 extension 340. This structure permits separate beam lead connections to chip I/O 318 and 320 each of which is aligned and facing each other and which would be as electrically interconnected if an ILB end of a beam lead were placed between the inner end 342 of contact pad 316 and the inner end 344 of contact pad 314.

As used herein, the term conducting pattern on an active device surface can refer to a unitary pattern of conducting material at the active device face. The pattern can be electrically connected to one or more terminals or to no terminal at the active device face. The term conducting pattern can also refer to a plurality of distinct conducting elements at the active device face. Each element can be electrically connected to one or more terminals or to no terminal at the active device face. In a double-device structure of the present invention a beam lead ILB site is bonded between parts of the conducting pattern, on the first and second devices, which are aligned when the active faces of each device are placed facing each other. Terminals on the first and second devices are electrically interconnected by the ILB site bonded between the conducting patterns only if the conducting patterns, to which the ILB site is bonded, are electrically connected to terminals on the first and second devices. A beam lead ILB site can be bonded between conducting patterns which are not electrically connected to a terminal on either the first or second device. A beam lead ILB site can be bonded between conducting patterns which are electrically connected to a terminal on one device but not on the other device.

FIG. 15 shows the double substrate structure 76 of FIG. 4 mounted onto a dielectric substrate 212, such as for example a printed circuit board (PC board) or a ceramic, glass ceramic or polymer packaging substrate. Dielectric substrate 212 can have multi-layers of conductors therein separated by layers of the dielectric material forming substrate 212. In addition or alternatively, conducting lines can be formed on the surface 214 of substrate 212. These conducting lines end in pads 216 on the surface of substrate 212. OLB ends 102 of beam leads 98 are bonded to pads 216. Commonly used methods to bond OLB ends of beam leads to contact pads are by thermocompression bonding, ultrasonic bonding and solder bonding. Further included in FIG. 15 is a means for dissipating heat 218 generated within the double substrate assembly.

During the operating of the double substrate assembly, 76 currents are forced into beam leads or voltages are applied between beam leads to supply electrical power to the substrates. Typically, at least one of the substrates is a semiconductor chip which has electrical elements therein such as for example resistors and PN junctions within which heat is generated where current passes through these elements.

The means for dissipating heat is thermally connected to the back face 86 of chip 78. The means for dissipating heat 218 is shown in FIG. 15 as a heat radiator 218 containing fins 220 attached to a base of the radiator 222. Heat radiators of this configuration are commonly formed from molded aluminum or copper. The base 222 of radiator 218 is thermally attached to the back 86 of substrate 78 with thermal grease or by solder bonding the base 222 to a metal pad on the back 86 of substrate 78 or by other die attach techniques including adhesives. A plurality of fins 220 are attached to base 222. A fluid such as air or water can pass over the fins 220 to remove heat from radiator 218. The double substrate assembly 76 in FIG. 15 can be replaced by the double substrate assembly 2 of FIG. 1, by the double substrate assembly 144 of FIG. 6 by the double substrate assembly 179 of FIG. 7, and by the double substrate assembly 210 of FIG. 8.

Figure 16:
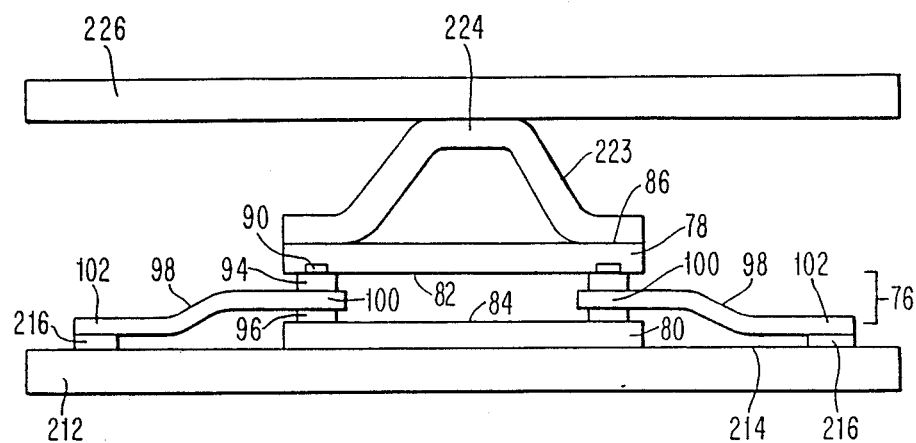
FIG. 16 shows a double electronic device structure with a thermal bus thermally connected to the back of one device, the assembly being mounted to a substrate.
Figure 17:
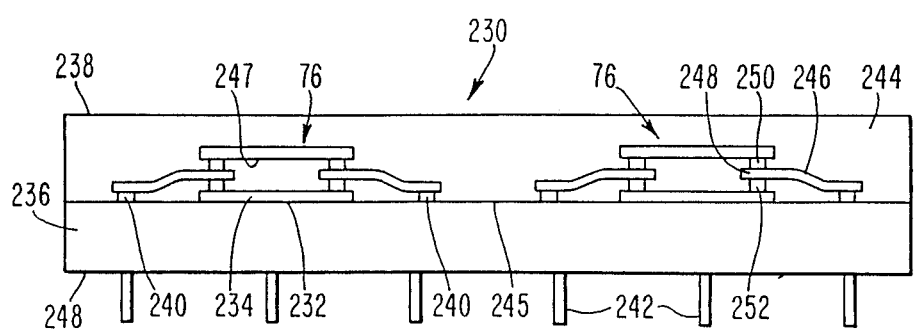
FIG. 17 shows a capped, multi-device module containing two double device structures.

FIG. 16 shows an alternate embodiment for the removal of heat generated in a double substrate structure. In place of the finned means for dissipating heat 218 shown in FIG. 15, thermally conductive path 223 is thermally mounted to the back 86 of substrate 78. The conductive path can be thermally mounted to substrate 78 by means such as, for example, thermal grease, soldering to a metal pad on back 86 of substrate 78 or other die attach techniques including adhesives. The thermally conductive path 223 is thermally connected at 224 to thermal bus 226. The thermal connection at 224 can be made by means commonly known in the art. The structure of thermally conductive path 223 can be formed from molded conductive material such as aluminum or copper. The shape of conductive path 222 shown in cross section in FIG. 16 as a cup shape is exemplary only. The suitable conductive paths such as a solid block of conductive material thermally connecting substrate 78 to bus 226 can also be used. More than one double substrate assembly 76 can be mounted on packaging substrate 212, as shown in FIG. 17. Each such assembly can have mounted on the back of the upper substrate a conductive path such as 223 which is thermally connected to the same thermal bus 226. Thermal bus 226 can be a solid conducting material such as, for example, a sheet of aluminum or copper. The thermal bus can be thermally connected to commonly used cooling systems for extraction of heat from the thermal bus and the double substrate assemblies.

Alternatively, the thermal bus 226 can be a hollow member through which a coolant such as, for example, water, air or other suitable fluid is passed to extract heat from the double substrate assemblies such as 76. The double substrate assembly 76 in FIG. 9 can be replaced by the double substrate assembly 2 of FIG. 1, by the double substrate assembly 144 of FIG. 6, by the double substrate assembly 179 of FIG. 7 and by the double substrate assembly 210 of FIG. 8.

FIG. 17 shows two double substrate structures mounted within a module 230. The back face 232 of the bottom substrate 234 is disposed on a packaging substrate 236 which is typically formed of a ceramic, glass ceramic, polymeric material or the like. Packaging substrate 236 typically contains multi-levels of electrically interconnected metal patterns not shown which electrically interconnect assemblies 76 to each other and contact pads 240 to pins 242. A cap 238 typically made of aluminum or ceramic material is placed over the top of the packaging substrate 236 to enclose the dual substrate assemblies 76. Typically, the cap 238 is hermetically sealed by commonly known means to the packaging substrate 236 at the substrate periphery 248. The space enclosed 244 by the cap is typically filled with an inert atmosphere such as nitrogen to prevent corrosion of conducting patterns on or near the surface of the packaging substrate 245 and on or near the active faces of the substrates of the double substrate structures 76.

The chip and packaging substrate conducting patterns are typically made of metals such as aluminum, copper and alloys thereof. These conducting materials are exemplary and not limiting. Conducting patterns formed from such materials corrode on exposure to atmospheric oxygen and water vapor. Typically, the top layer of conducting patterns on a semiconductor chip are covered with a dielectric material such as silicon dioxide and the top layer of conductors on a packaging substrate is covered with a dielectric material such as a polymer or ceramic. Electrical connection is made to the patterns through conductor filled via holes in the dielectric. The dielectric surface may not provide adequate environmental isolation of the conducting patterns due to pin holes and microcracks in the dielectric and due to spaces between dielectric and the conductor filling the via holes. Corrosion such as oxidation can increase resistance and cause electrical opens in conducting lines forming the patterns. Also such corrosion can occur in the region of the interconnection of the ILB ends 248 of the beam lead 246 and the contact pads 250 and 252 of FIG. 17 causing increased contact resistance and opens.

FIG. 17 shows a double substrate assembly 76 which is shown in and described with reference to FIG. 4. The double substrate assembly in FIG. 19 can be replaced by the double substrate assembly 2 of FIG. 1, by the double substrate assembly 144 of FIG. 6, by the double substrate assembly 179 of FIG. 7 and by the double substrate assembly 210 of FIG. 8.

Figure 18:
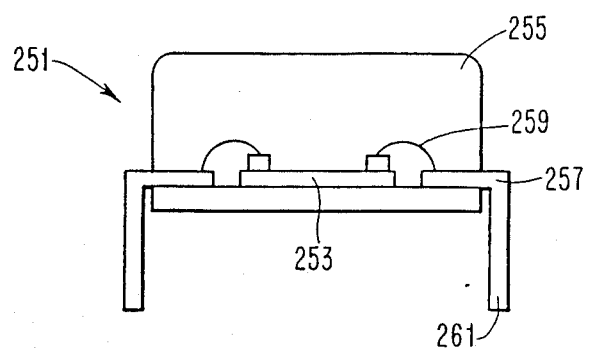
FIG. 18 schematically shows a DIP type package with a chip therein wire bonded to beam leads projecting outwardly from the package.

An alternative semiconductor chip package commonly referred to as a dual in line package (DIP) is schematically shown in FIG. 18 as 251. A DIP typically has a semiconductor chip 253 enclosed by a molded plastic 255 which serves to isolate the chip from corrosive environments and mechanical damage. Beam leads 257 are electrically connected to chip contact pads typically by wires 259. The beam leads project outwardly from the molded plastic to provide a means for electrical connection to the DIP package.

A number of modules of the type shown in FIG. 17 or DIP packages of FIG. 18 generally are mounted onto printed circuit boards. Pins 242 of FIG. 17 or beam lead ends 261 of a DIP package of FIG. 18 are electrically connected to the printed circuit boards either by inserting the pins or beam lead ends into a socket on the circuit board or soldering to contact pads on the circuit board.

The need for housings such as those shown in FIGS. 17 and 18 to isolate the enclosed structures can be avoided by providing a means to provide isolation from corrosive environments and mechanical damages only in the regions where it is required. As previously described with reference to FIG. 17, the region between chips in a double-chip structure contains structures which are subject to corrosion when exposed to atmospheric oxygen, water vapor etc.

Figure 19:
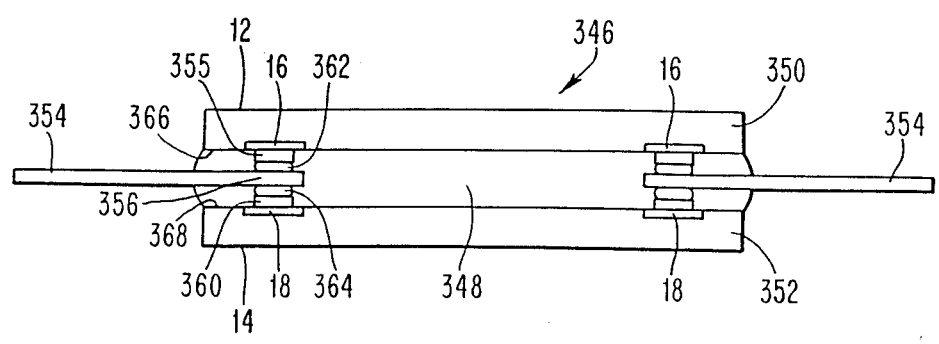
FIG. 19 shows a double electronic device structure such as shown in FIG. 4 with a passivating material in the space between the devices.

In FIG. 19 there is shown a structure 346 which is the same as structure 2 of FIG. 1 with the addition of a material 348 between substrate 350 and substrate 352. The material 348 substantially fills the space between substrates 350 and 352. Material 348 provides mechanical support to the beam leads 354 which project outwardly from between substrates 350 and 352 where ILB end 356 of beam lead 354 is bonded between both solder wettable contact pads 358 and 360 through solder mounds 362 and 364 respectively.

Material 348 also provides sufficient isolation from the external environment to prevent corrosion described above. Material 348 must also adhere to active faces 366 of substrate 350, to active face 368 of substrate 352 and to the beam leads 354 to substantially prevent the external atmosphere from entering the region between the substrates. It is the preferred embodiment of the present invention to provide material 348 to a double substrate structure such as shown in FIG. 19 after the first and second substrate are mounted together and electrically interconnected. To achieve this, a liquid polymer is allowed to flow by capillary action into the space between substrates 350 and 352. In a double substrate structure as shown in FIG. 1, FIG. 4 and FIG. 6, the substrate to substrate spacing is typically of the order of 1 to 5 milli-inches. Therefore, the liquid polymer must have sufficiently low viscosity and be sufficiently wetting to flow within this narrow space.

Examples of materials useful as interplanar materials in the structures of the present invention are described in co-pending U.S. patent application Ser. No. 096,690 entitled "Encapsulation Composition and Use Thereof" to Buchwalter et al. filed September 15, 1987 which is incorporated herein by reference. The Buchwalter et al. application describes compositions referred to herein as cycloaliphatic epoxide compositions which contain a cycloaliphatic epoxide; an anhydride of an organic dicarboxylic acid; and an alkylene oxide adduct of an imidazole. The anhydride of the organic carboxylic acid is present in amount sufficient to harden the cycloaliphatic epoxide. The alkylene oxide adduct of the imidazole is present in an amount sufficient to promote the hardening of the cycloaliphatic epoxide.

In the Buchwalter et al. application the materials were forced under pressure in a reaction injection molding process within various spaces between closely spaced beam leads. Quite surprisingly, it has been found that these materials can flow within various spaces by capillary action without the requirement of pressure.

The encapsulating liquid polymeric material can be applied to the double electronic device structure along the edge of the devices with a beveled tipped stainless steel needle until a fillet of material is observed surrounding the edge of the devices of the structure.

The following are examples of polymers and curing ramps useful to form interplanar encapsulation materials. The structures are preheated to the specified temperature prior to deposition of the liquid polymer. The liquid polymer is thereafter cured.

1. Cycloaliphatic epoxy composition:
    preheat structure to 60°-70° C.
    cure: 5 minutes at 140° C. followed by 185° C. for 2 hours
2. Sylgard (a silicone gel manufactured by Dow Corning):
    preheat structure to 80°-100° C.
    cure: 6 minutes at 140° C.
3. Hysol 455-10(an unfilled, flexibilized epoxy manufactured by Dexter Hysol):
    preheat structure to 80°-100° C.
    cure: 6 hours at 150° C.
4. Hysol 405-32(an unfilled epoxy manufactured by Dexter Hysol): preheat package to 80°-100° C.
    cure: 6 hours at 150° C.
5. Amicon 3620(an addition cured silicon rubber manufactured by Emerson & Cuming a Grace Company):
    preheat package to 80°-100° C.
    cure: 3 hours at 150° C.
6. Dow Corning R-6102(an addition cured silicon rubber):
    preheat package to 80°-100° C.
    cure: 3 hours at 150° C.

The preferred liquid polymeric materials to form an interplanar encapsulation material substantially filling the space between a double-chip structure most preferably have the following characteristics: (1) be 100 percent solid, i.e., solvent free; (2) be unfilled or filled with particles of mesh size less than about the minimum of the chip to substrate space or the minimum space between the means electrically interconnecting chip and substrate; (3) have ionic purity less than about 50 ppm extractable ionics such as Cl, F, Na and K; (4) have good wettability of surface to be coated and low viscosity so that it can readily flow within narrow spaces; (5) have good adhesion to the wetted surfaces after curing; (6) have low stress after curing so as not to press the two chips of the double-chip structure away from each other thereby placing the means electrically interconnecting the two chips in tension which could result in electrically disconnecting the chips.

In order to adjust the thermal coefficient of expansion (CTE) of a polymeric material to better match the TCE of a substrate such as a semiconductor chip on which the polymeric material is deposited, a filler is commonly added to the polymeric material. Fillers are fine particles of material such as silicon dioxide ($SiO_2$), aluminum oxide ($Al_2O_3$), tantalum pentoxide ($Ta_2O_5$), silicon carbide (SiC), boron carbide ($B_4C$), tungsten carbide (WC), silicon nitride ($Si_3N_4$) and lithium aluminum silicate compounds. It has been found that unfilled undercoat compositions are most preferable to practice the present invention.

The polymeric materials of the Buchwalter et al. application and of the examples above exhibit relatively low viscosity. Moreover, these compositions avoid ionic contamination due to ions such as chlorine, sodium, fluorine and other halide ions. This material, when deposited between the double substrate structures of FIG. 1, FIG. 4, FIG. 6 and FIG. 7 excludes the ambient atmosphere surrounding the structure; furthermore, since the liquid polymer is solvent free, the polymeric material after curing is substantially void free.

While the invention has been illustrated and described with respect to preferred embodiments, it is to be understood that the invention is not limited to the precise constructions herein disclosed, and the right is reserved to all changes and modifications coming within the scope of the invention as defined in the appended claims.

Having thus described our invention, what we claim as new, and desire to secure by Letters Patent is:

1. A structure comprising:
    a first and second electronic device each having a first face and a second face, there being a plurality of input/output terminals extending to at least said first face of each of said devices, there being a pattern at said first face of said first and said second devices at least a portion of which is electrically conducting and connected to at least a portion of said terminals on said first faces of said first and said second devices;
    said first and second devices being mounted together, with said first face of said first device facing said first face of said second device, at least a portion of said pattern on said first device being aligned opposite to at least a portion of said pattern on said second device;
    a plurality of beam leads projecting outwardly from between said first and said second devices;
    each of said beam leads having an inner and outer lead bond site; and
    said inner lead bond site of at least one of said beam leads being solderlessly bonded between said at least a portion of said pattern on said first device and said at least a portion of said pattern on said second device, said inner lead bond site being aligned between and in substantially a straight line with said oppositely aligned portions of said pattern on said devices, said straight line being normal to said first faces of said devices.
2. The structure of claim 1, wherein said beam lead has a protuberance at said inner lead bond site.
3. The structure of claim 1, further including a means for dissipating heat thermally connected to at least said second face of at least one of said first and said second devices.
4. The structure of claim 1, further including a packaging substrate, said substrate being disposed on the back face of one of said devices, said outer lead bond sites being bonded to contact pads on said packaging substrate.
5. The structure of claim 4 wherein said packaging substrate is formed from a material selected from the group consisting of a ceramic, glass ceramic and a polymer.
6. The structure of claim 1, wherein said first and said second devices are selected from the group consisting of an integrated circuit chip and a substrate containing at least one capacitor.
7. The structure of claim 1, wherein the space between said first and second devices is substantially filled with a polymeric material.
8. A structure comprising:
    a tape having a plurality of sets of beam leads, each of said sets having a plurality of beam leads formed from a conducting material, each lead of said plurality having an inner lead bond site and an outer lead bond site;
    a first and second electronic device at each of said set locations, each of said first and second devices having a first face and a second face, there being a plurality of input/output terminals extending to at least said first face of each of said devices, there being a pattern at said first faces of said first and said second devices at least a portion of which is electrically conducting and connected to at least a portion of said terminals on said first and said second devices;

said first and second devices at each of said set locations being mounted together, with said first face of said first device facing said first face of said second device, at least a portion of said pattern on said first device being aligned opposite to at least a portion of said pattern on said second device; and said inner lead bond site of at least one beam lead of each of said beam lead sets being solderlessly bonded between said at least a portion of said pattern on said first device and said at least a portion of said pattern on said second device, said inner lead bond site being aligned between and in substantially in a straight line with said oppositely aligned portions of said patterns on said devices, said straight line being normal to said first faces of said devices.

9. The structure of claim 8, wherein said tape is a unitary conductive film with said beam leads formed therein.

10. The structure of claim 8, wherein said tape consists of at least one polymeric layer with said beam lead sets adhering thereto, there being an aperture in said at least one polymer layer in the vicinity of each of said set locations, said inner lead bonding sites of said beam leads extending in cantilevered fashion over said aperture.

11. The structure of claim 8, wherein said first and said second devices are selected from the group consisting of an integrated circuit chip and a substrate containing at least one capacitor.

12. The structure of claim 8, wherein the space between said first and said second devices is substantially filled with a polymeric material.

* * * * *